(12) United States Patent
Son et al.

(10) Patent No.: US 11,605,551 B2
(45) Date of Patent: Mar. 14, 2023

(54) CHUCK ASSEMBLY, SEMICONDUCTOR DEVICE FABRICATING APPARATUS INCLUDING THE SAME, AND METHOD OF FABRICATING SEMICONDUCTOR DEVICE

(71) Applicant: Samsung Electronics Co., Ltd., Suwon-si (KR)

(72) Inventors: Youngjae Son, Suwon-si (KR); Guesuk Lee, Seoul (KR); Taemin Earmme, Hwaseong-si (KR); Hyeongyun Lee, Hwaseong-si (KR); Seungchul Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 90 days.

(21) Appl. No.: 17/408,437

(22) Filed: Aug. 22, 2021

(65) Prior Publication Data
US 2022/0223452 A1    Jul. 14, 2022

(30) Foreign Application Priority Data

Jan. 12, 2021  (KR) .................. 10-2021-0003903

(51) Int. Cl.
*H01L 21/683*    (2006.01)
*H01L 21/67*    (2006.01)

(52) U.S. Cl.
CPC .... *H01L 21/6833* (2013.01); *H01L 21/67103* (2013.01)

(58) Field of Classification Search
CPC ......... H01L 21/67103; H01L 21/67109; H01L 21/6831; H01L 21/6833; H01L 21/68735; H01J 37/23724

USPC ......................................................... 361/234
See application file for complete search history.

(56) References Cited

U.S. PATENT DOCUMENTS

| | | | |
|---|---|---|---|
| 6,475,336 B1 | 11/2002 | Hubacek | |
| 7,244,336 B2 | 7/2007 | Fischer et al. | |
| 7,655,579 B2 | 2/2010 | Miyagawa et al. | |
| 8,449,679 B2 | 5/2013 | Dhindsa | |
| 8,555,810 B2 | 10/2013 | Park et al. | |
| 9,852,889 B1 * | 12/2017 | Kellogg | H01J 37/32091 |
| 10,714,370 B2 | 7/2020 | Tomioka et al. | |
| 2010/0040768 A1 * | 2/2010 | Dhindsa | H01J 37/32724 427/248.1 |

(Continued)

FOREIGN PATENT DOCUMENTS

| | | | |
|---|---|---|---|
| KR | 101171422 B1 | 8/2012 | |
| KR | 101235151 B1 | 2/2013 | |
| WO | WO-2005059962 A2 * | 6/2005 | ........ H01J 37/32642 |

*Primary Examiner* — Kevin J Comber
(74) *Attorney, Agent, or Firm* — Muir Patent Law, PLLC

(57) ABSTRACT

Disclosed are chuck assemblies, semiconductor device fabricating apparatuses, and methods of fabricating semiconductor devices. The chuck assembly comprises a chuck base including lower and upper bases, a ceramic plate on the upper base, an edge ring that surrounds the ceramic plate, a ground ring that surrounds an outer sidewall of the edge ring on an edge portion of the lower base, a coupling ring between the ground ring and the upper base and between the edge ring and the edge portion of the lower base, an upper heat sink between the coupling ring and the edge ring, and a sidewall heat sink between the coupling ring and the ground ring and between the coupling ring and the upper base.

20 Claims, 9 Drawing Sheets

(56) References Cited

U.S. PATENT DOCUMENTS

| | | |
|---|---|---|
| 2011/0247759 A1 | 10/2011 | Kitajima et al. |
| 2015/0200080 A1* | 7/2015 | Kikuchi ............ H01L 21/67109 |
| | | 156/345.27 |
| 2016/0289827 A1 | 10/2016 | Augustyniak et al. |
| 2017/0053820 A1 | 2/2017 | Bosch et al. |
| 2019/0088512 A1* | 3/2019 | Zucker .............. H01L 21/67069 |

* cited by examiner

CHUCK ASSEMBLY, SEMICONDUCTOR DEVICE FABRICATING APPARATUS INCLUDING THE SAME, AND METHOD OF FABRICATING SEMICONDUCTOR DEVICE

CROSS-REFERENCE TO RELATED APPLICATION(S)

This U.S. nonprovisional application claims priority under 35 U.S.C § 119 to Korean Patent Application No. 10-2021-0003903 filed on Jan. 12, 2021 in the Korean Intellectual Property Office, the disclosure of which is hereby incorporated by reference in its entirety.

BACKGROUND

The present inventive concepts relate to an apparatus and a method for fabricating a semiconductor device, and more particularly, to a chuck assembly that loads a substrate, a semiconductor device fabricating apparatus including the same, and a method of fabricating a semiconductor device.

In general, semiconductor devices are manufactured by applying a plurality of unit processes. The unit processes may include a thin-film deposition process, a photolithography process, and an etching process. The etching process may include a dry etching process in which a plasma reaction is used. A dry etching apparatus may include an electrostatic chuck on which a substrate (e.g., a wafer substrate) is placed. The chuck assembly may use an electrostatic force to rigidly hold the wafer substrate. However, several units of the chuck assembly heated by plasma during an etching process may be needed to efficiently cool for increasing etching uniformity of the substrate and life spans of the units of the chuck assembly.

SUMMARY

Some embodiments of the present inventive concepts provide a chuck assembly capable of increasing life spans of an edge ring and a ground ring, a semiconductor device fabricating apparatus including the same, and a method of fabricating a semiconductor device.

According to some embodiments of the present inventive concepts, a chuck assembly may comprise: a chuck base that includes a lower base and an upper base on the lower base; a ceramic plate on the upper base; an edge ring on an outer sidewall of the ceramic plate and on an edge portion of the lower base; a ground ring that surrounds an outer sidewall of the edge ring on the edge portion of the lower base; a coupling ring between an inner sidewall of the ground ring and an outer sidewall of the upper base and between the edge portion of the lower base and a bottom surface of the edge ring; an upper heat sink between a top surface of the coupling ring and the bottom surface of the edge ring; and a sidewall heat sink between an outer sidewall of the coupling ring and the inner sidewall of the ground ring and between an inner sidewall of the coupling ring and the outer sidewall of the upper base.

According to some embodiments of the present inventive concepts, an apparatus for fabricating a semiconductor device may comprise: a chamber that includes a lower housing and an upper housing on the lower housing; a showerhead in an upper portion of the upper housing; a chuck assembly in a lower portion of the lower housing, the chuck assembly for loading a substrate; and a first coolant supply connected to the chuck assembly, the first coolant supply configured to provide a first coolant to a bottom surface of the substrate. The chuck assembly may include: a chuck base that includes a lower base and an upper base on the lower base; a ceramic plate on the upper base; an edge ring on an outer sidewall of the ceramic plate and on an edge portion of the lower base; a ground ring that surrounds an outer sidewall of the edge ring on the edge portion of the lower base; a coupling ring between an inner sidewall of the ground ring and an outer sidewall of the upper base and between the edge portion of the lower base and a bottom surface of the edge ring; an upper heat sink between a top surface of the coupling ring and the bottom surface of the edge ring; and a sidewall heat sink between an outer sidewall of the coupling ring and the inner sidewall of the ground ring and between an inner sidewall of the coupling ring and the outer sidewall of the upper base.

According to some embodiments of the present inventive concepts, a method of fabricating a semiconductor device may comprise: loading a substrate on a ceramic plate on a chuck base; providing a reaction gas onto the substrate; providing a source power to generate plasma on the substrate; cooling the substrate by providing a first coolant to a bottom surface of the substrate through the chuck base and the ceramic plate; and cooling an edge ring that surrounds the substrate, a ground ring that surrounds the edge ring, and a coupling ring below the edge ring by using an upper heat sink between the edge ring and an edge portion of the chuck base and a sidewall heat sink between the upper heat sink and the edge portion of the chuck base.

DETAILED DESCRIPTION OF EMBODIMENTS

Figure 1:
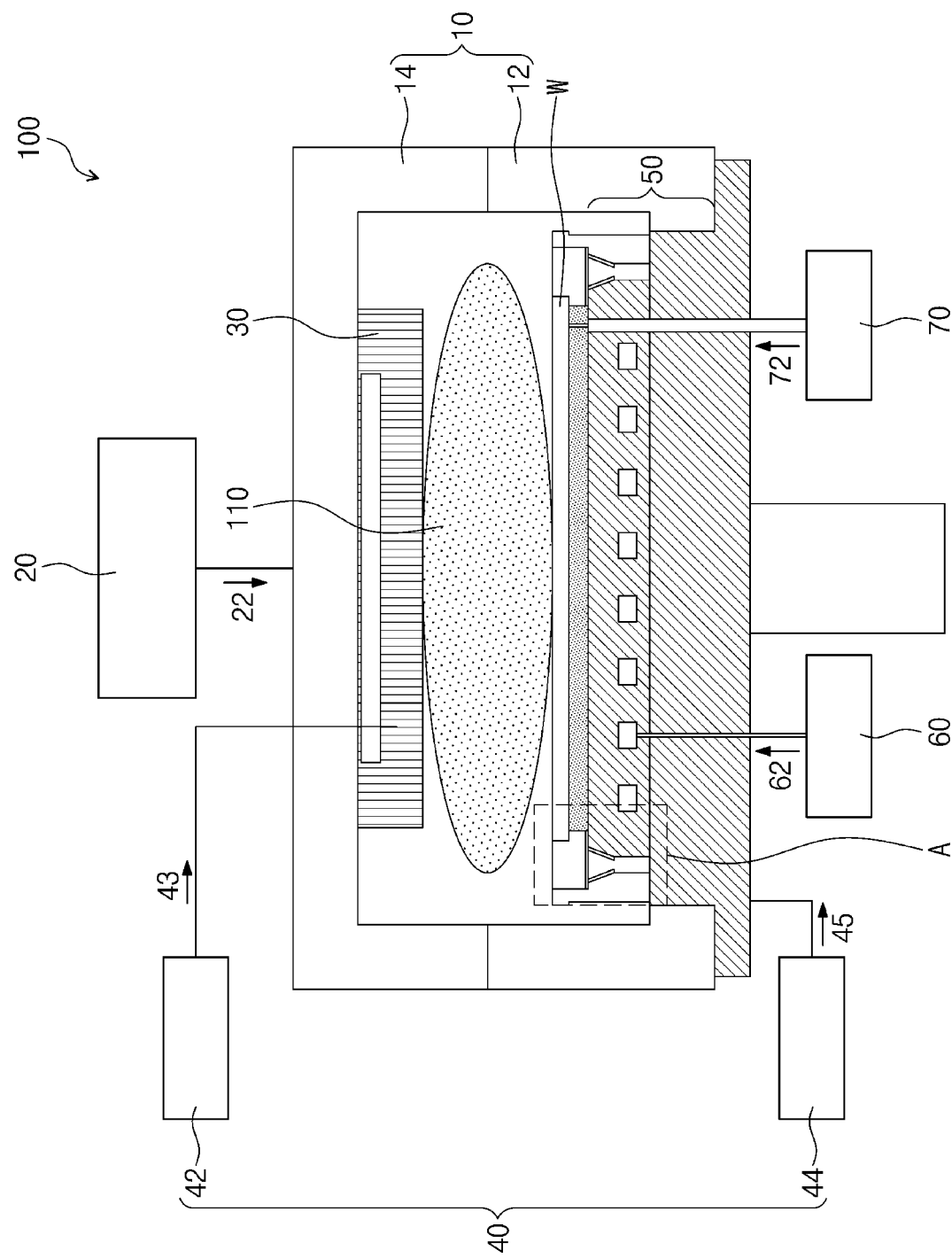
FIG. 1 illustrates a schematic cross-sectional view showing an example of a semiconductor device fabricating apparatus according of the present inventive concepts.

FIG. 1 shows an example of a semiconductor device fabricating apparatus 100 according to the present inventive concepts.

Referring to FIG. 1, the semiconductor device fabricating apparatus 100 of the present inventive concepts may be a capacitively coupled plasma (CCP) etching apparatus. Alternatively, the semiconductor device fabricating apparatus 100 may be an inductively coupled plasma (ICP) etching apparatus or a microwave plasma etching apparatus, but the present inventive concepts are not limited thereto. For example, the semiconductor device fabricating apparatus 100 may include a chamber 10, a gas supply 20, a showerhead 30, a power supply 40 such as a radio-frequency power supply, a chuck assembly 50, a cooling-water supply 60, and a first coolant supply 70.

The chamber 10 may provide an isolated space from the outside. A substrate W may be provided in the chamber 10. The substrate W may include a silicon wafer, but the present inventive concepts are not limited thereto. In an embodiment, the chamber 10 may include a lower housing 12 and an upper housing 14. When the substrate W is provided into the chamber 10, the lower housing 12 may be separated from the upper housing 14. When the substrate W undergoes a treatment process (e.g., etching process), the lower housing 12 may be coupled to the upper housing 14.

The gas supply 20 may provide a reaction gas 22 into the chamber 10. The reaction gas 22 may etch the substrate W or a thin layer (not shown) on the substrate W. For example, the reaction gas 22 may include $CH_3$ or $SF_6$. Alternatively, the reaction gas 22 may deposit a thin layer on the substrate W, but the present inventive concepts are not limited thereto.

The showerhead 30 may be provided in an upper portion of the upper housing 14. The showerhead 30 may be connected to the gas supply 20. The showerhead 30 may provide the substrate W with the reaction gas 22. The showerhead 30 may be connected to the power supply 40.

The power supply 40 may be installed outside the chamber 10. The power supply 40 may be associated with the showerhead 30 and the chuck assembly 50. The power supply 40 may provide the showerhead 30 or the chuck assembly 50 with radio-frequency power, such as a bias power 45 and a source power 43. In an embodiment, the power supply 40 may include a first power supply 42 and a second power supply 44.

The first power supply 42 may be connected to the showerhead 30. The first power supply 42 may provide the showerhead 30 with the source power 43. The source power 43 may induce plasma 110 in the chamber 10. Although not shown, the first power supply 42 may be connected to the chuck assembly 50. The first power supply 42 may provide the chuck assembly 50 with the source power 43, but the present inventive concepts are not limited thereto.

The second power supply 44 may be connected to the chuck assembly 50. The second power supply 44 may provide the chuck assembly 50 with the bias power 45. The bias power 45 may concentrate the plasma 110 on the substrate W. The substrate W may be etched proportional to the bias power 45. When an etching depth of the substrate W or a thin layer reaches a certain degree, the source power 43 and the bias power 45 may have a pulse type.

The chuck assembly 50 may be provided on a center of the lower housing 12. The chuck assembly 50 may load the substrate W. The substrate W may be provided on a central portion of the chuck assembly 50. For example, the chuck assembly 50 may be an electrostatic chuck assembly. The chuck assembly 50 may rigidly hold the substrate W with an electrostatic voltage from an electrostatic voltage supply (not shown). The electrostatic voltage may be a direct voltage.

The cooling-water supply 60 may be connected to the chuck assembly 50. The cooling-water supply 60 may provide the chuck assembly 50 with a cooling water (or water coolant) 62. The cooling water 62 may circulate in the chuck assembly 50, thereby cooling the chuck assembly 50. For example, the cooling water may have room temperature (e.g., about 20° C.). The term such as "about" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range. The cooling water 62 may include de-ionized water, but the present inventive concepts are not limited thereto.

The first coolant supply 70 may be connected to the chuck assembly 50. The first coolant supply 70 may provide the chuck assembly 50 with a first coolant 72. The first coolant 72 may pass through the chuck assembly 50 and may then be provided onto a bottom surface of the substrate W. When the substrate W is heated with the plasma 110, the first coolant 72 may cool the substrate W and thus the substrate W may be prevented from being over-etched. Alternatively, the first coolant 72 may cool the substrate W to increase etching uniformity of the substrate W, but the present inventive concepts are not limited thereto. The first coolant 72 may be a gaseous coolant. For example, the first coolant 72 may include a helium (He) gas.

Figure 2:
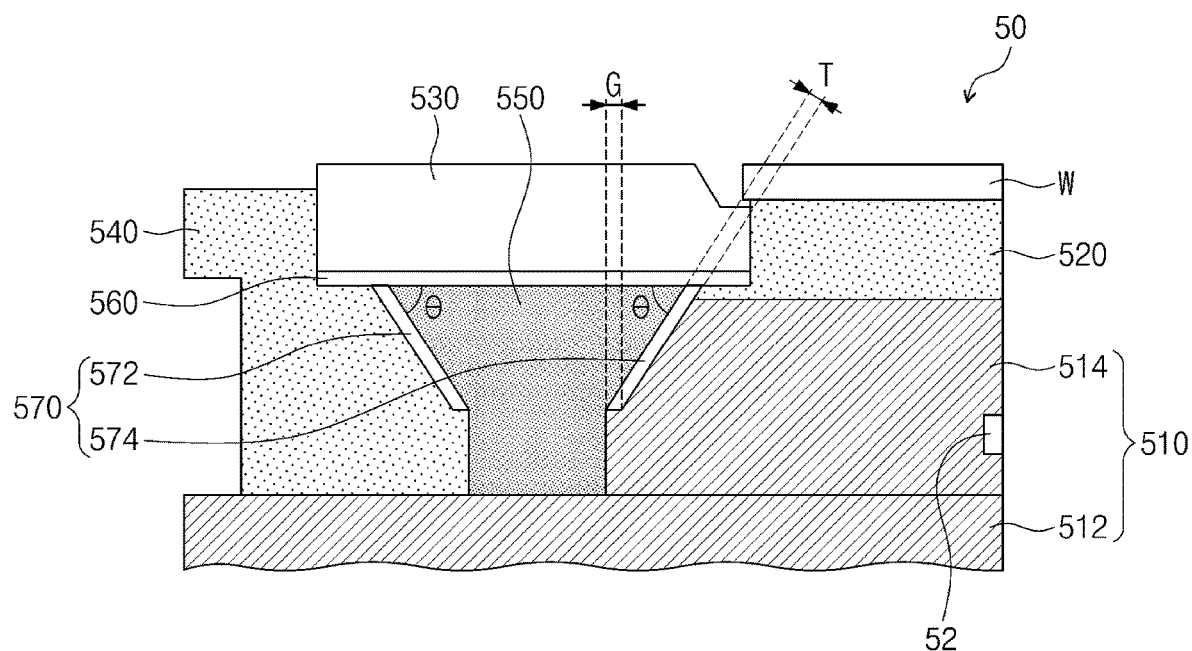
FIG. 2 illustrates a cross-sectional view showing an example of a chuck assembly in section A of FIG. 1 according to example embodiments.

FIG. 2 illustrates a cross-sectional view showing an example of the chuck assembly 50 in section A of FIG. 1 according to example embodiments.

Referring to FIGS. 1 and 2, the chuck assembly 50 may include a chuck base 510, a ceramic plate 520, an edge ring 530, a ground ring 540, a coupling ring 550, an upper heat sink 560, and a sidewall heat sink 570.

The chuck base 510 may support the ceramic plate 520, the edge ring 530, the ground ring 540, the coupling ring 550, the upper heat sink 560, and the sidewall heat sink 570. For example, the chuck base 510 may include aluminum or an aluminum alloy. The chuck base 510 may include a lower base 512 and an upper base 514.

The lower base 512 may be coupled to a lower portion of the lower housing 12. The lower base 512 may be in contact with an inner sidewall of the lower housing 12. The lower base 512 may be wider than the upper base 514. The lower base 512 may have an edge (or, an edge portion) exposed from the upper base 514. An edge (or an edge portion) of the lower base 512 may support the edge ring 530, the ground ring 540, and the coupling ring 550.

The upper base 514 may be provided on a center (or, a center portion) of the lower base 512. The upper base 514 may support the ceramic plate 520. The upper base 514 may support an inner edge of the upper heat sink 560 and the edge ring 530. For example, the upper base 514 may have a cooling-water hole 52. The cooling-water hole 52 may be connected to the cooling-water supply 60 of FIG. 1. The cooling-water hole 52 may circulate the cooling water 62 into the cooling-water supply 60. The cooling water 62 in the cooling-water hole 52 may cool the upper base 514.

The ceramic plate 520 may be provided on the upper base 514. The ceramic plate 520 may insulate the substrate W from the upper base 514. For example, the ceramic plate 520 may include aluminum oxide ($Al_2O_3$). Although not shown, the ceramic plate 520 may include heater electrodes and chuck electrodes, but the present inventive concepts are not limited thereto.

The edge ring 530 may be provided on an outer sidewall (e.g., outer surface) of the ceramic plate 520. The edge ring 530 may surround the outer sidewall of the ceramic plate 520. In addition, the edge ring 530 may surround an outer sidewall (e.g., outer surface) of the substrate W. The edge ring 530 may have a top surface coplanar with that of the substrate W. The top surface of the edge ring 530 may cause the substrate W to have an expanded and/or extended top surface with respect to the plasma 110, and thus it may be possible to reduce and/or remove etching defects on an edge (or an edge portion) of the substrate W. For example, the edge ring 530 may be a focus ring. The edge ring 530 may concentrate the plasma 110 on the substrate W. The edge ring 530 may include a material similar to that of the substrate W. For example, the edge ring 530 may include silicon carbide (SiC). Alternatively, the edge ring 530 may include quartz of $SiO_2$ or a ceramic of rare-earth element oxide such as $Y2O_3$, but the present inventive concepts are not limited thereto.

The ground ring 540 may be provided on the outer sidewall (e.g., outer surface) of the edge ring 530. The ground ring 540 may surround the edge ring 530 and the coupling ring 550. The ground ring 540 may be supported on the edge of the lower base 512. The ground ring 540 may be a confinement ring. The ground ring 540 may confine the plasma 110 on the substrate W and the edge ring 530. For example, the ground ring 540 may include quartz of $SiO_2$. For another example, the ground ring 540 may include a ceramic of rare-earth element oxide such as $Y_2O_3$, but the present inventive concepts are not limited thereto.

The coupling ring 550 may be provided between the edge of the lower base 512 and a bottom surface of the edge ring 530. For example, the coupling ring 550 may be provided between a top surface of the edge of the lower base 512 and the bottom surface of the edge ring 530. The coupling ring 550 may be provided between an inner sidewall (e.g., inner surface) of the ground ring 540 and an outer sidewall (e.g., outer surface) of the upper base 514. The coupling ring 550 may surround the upper base 514. The coupling ring 550 may have, for example, a Y-shaped cross-section. The coupling ring 550 may have a thermal conductivity greater than those of the edge ring 530 and the ground ring 540. The coupling ring 550 may include the same material as that of the ceramic plate 520. The coupling ring 550 may include aluminum oxide ($Al_2O_3$). A tolerance (or gap) G of about 0.2 mm to about 0.4 mm may be provided between an inner sidewall of the coupling ring 550 and the outer sidewall of the upper base 514. Likewise, a tolerance of about 0.2 mm to about 0.4 mm may be provided between an outer sidewall of the coupling ring 550 and the inner sidewall of the ground ring 540.

The upper heat sink 560 may connect the edge ring 530 to the coupling ring 550. The upper heat sink 560 may be provided between a bottom surface of the edge ring 530 and a top surface of the coupling ring 550. The upper heat sink 560 may conduct and/or transfer heat from the edge ring 530 to the coupling ring 550, the sidewall heat sink 570, and the upper base 514. The upper heat sink 560 may cool the edge ring 530 that is heated with the plasma 110, which may result in an increase in life span of the edge ring 530. This may be caused that an etch rate of the edge ring 530 is proportional to temperature of the edge ring 530. The upper heat sink 560 may include a metallic radiation sheet commercially known as Q-pad.

The sidewall heat sink 570 may be provided on opposite inner and outer sidewalls of the coupling ring 550. For example, the sidewall heat sink 570 may be provided between the inner sidewall of the coupling ring 550 and the outer sidewall of the upper base 514 and between the outer sidewall of the coupling ring 550 and the inner sidewall of the ground ring 540. The sidewall heat sink 570 may cause the upper base 514 to receive heat generated from the edge ring 530, the ground ring 540, the coupling ring 550, and the upper heat sink 560, thereby increasing life spans of the edge ring 530 and the ground ring 540. The sidewall heat sink 570 may be formed of the same material as that of the upper heat sink 560. For example, the sidewall heat sink 570 may include a radiation sheet commercially known as Q-pad. The sidewall heat sink 570 may have a thickness T of about 0.15 mm. The sidewall heat sink 570 may have an inclination angle θ of about 22° to about 48.5° relative to a bottom surface of the upper heat sink 560. The inclination angle θ may correspond to an inverse sine function of the thickness T of the sidewall heat sink 570 over the tolerance G, or $\theta=\sin^{-1}(T/G)$. For example, the sidewall heat sink 570 may include a first sidewall heat sink 572 and a second sidewall heat sink 574.

The first sidewall heat sink 572 may be provided between the inner sidewall of the ground ring 540 and the outer sidewall of the coupling ring 550. The first sidewall heat sink 572 may connect the ground ring 540 to the coupling ring 550. The first sidewall heat sink 572 may transfer heat from the ground ring 540 to the coupling ring 550, thereby increasing a life span of the ground ring 540.

The second sidewall heat sink 574 may be provided between the inner sidewall of the coupling ring 550 and the outer sidewall of the upper base 514. The second sidewall heat sink 574 may connect the coupling ring 550 to the upper base 514. The second sidewall heat sink 574 may transfer heat from the coupling ring 550 to the upper base 514, thereby increasing life spans of the edge ring 530 and the ground ring 540.

Figure 3:
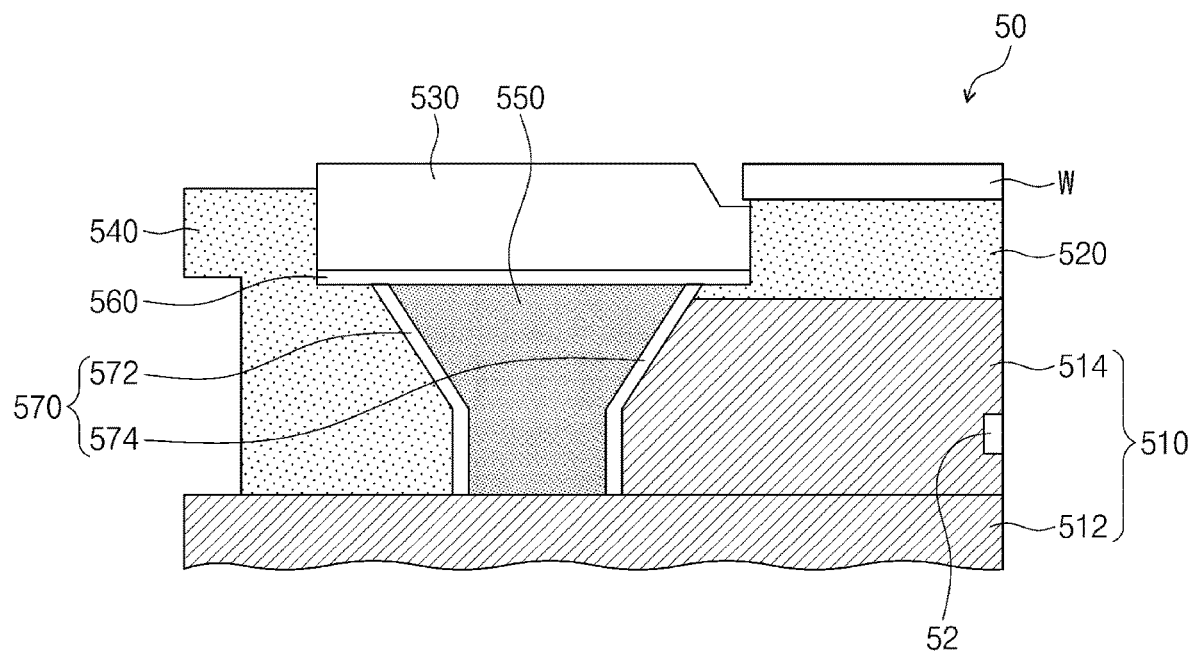
FIG. 3 illustrates a cross-sectional view showing an example of a chuck assembly depicted in FIG. 1 according to example embodiments.

FIG. 3 shows an example of the chuck assembly 50 depicted in FIG. 1 according to example embodiments.

Referring to FIG. 3, the chuck assembly 50 may be configured such that the first and second sidewall heat sinks 572 and 574 may be connected to the top surface of the edge of the lower base 512. The first and second sidewall heat sinks 572 and 574 may connect the upper heat sink 560 to the top surface of the edge of the lower base 512. For example, the first and second sidewall heat sinks 572 and 574 may contact the upper heat sink 560 and the lower base 512. The term "contact" or "in contact with" as used herein refers to a direct connection, e.g., touching. The first and second sidewall heat sinks 572 and 574 may transfer heat from the edge ring 530 to the lower base 512, thereby increasing life spans of the edge ring 530 and the ground ring 540. The coupling ring 550 may have a Y-shaped cross-section, and each of the first and second sidewall heat sinks 572 and 574 may have a bended cross-section.

The upper base 514, the ceramic plate 520, the edge ring 530, the ground ring 540, and the coupling ring 550 may be configured identically to those of FIG. 2.

Figure 4:
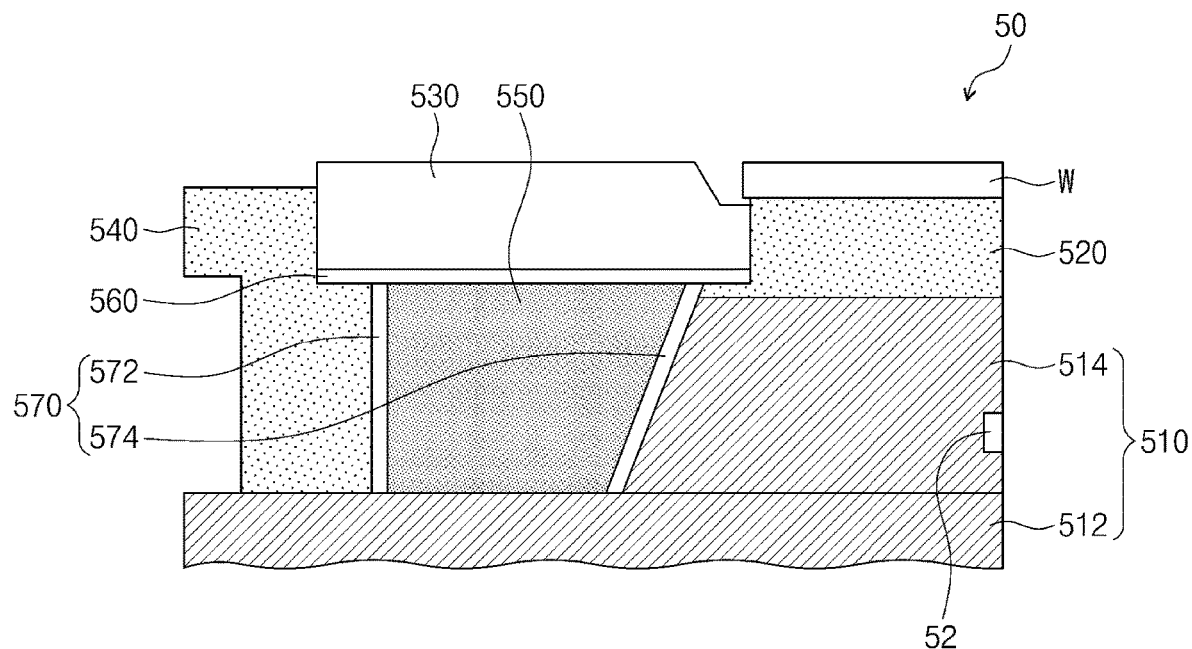
FIG. 4 illustrates a cross-sectional view showing an example of a chuck assembly depicted in FIG. 1 according to example embodiments.

FIG. 4 shows an example of the chuck assembly 50 depicted in FIG. 1 according to example embodiments.

Referring to FIG. 4, the chuck assembly 50 may be configured such that the first and second sidewall heat sinks 572 and 574 may have their cross-sections that are asymmetric with each other. For example, the first sidewall heat sink 572 may have a cross-section shaped like a vertical straight line relative to a top surface of the lower base 512 (or, the top surface of the edge of the lower base 512), and the second sidewall heat sink 574 may have a cross-section shaped like an inclined straight line relative to the top surface of the lower base 512. The second sidewall heat sink 574 may increase a contact area between the outer sidewall of the upper base 514 and the inner sidewall of the coupling ring 550, and thus the coupling ring 550 may increase in cooling efficiency. The coupling ring 550 may have a trapezoidal cross-section.

The lower base 512, the upper base 514, the ceramic plate 520, the edge ring 530, the ground ring 540, the coupling ring 550, and the upper heat sink 560 may be configured identically to those of FIG. 2.

Figure 5:
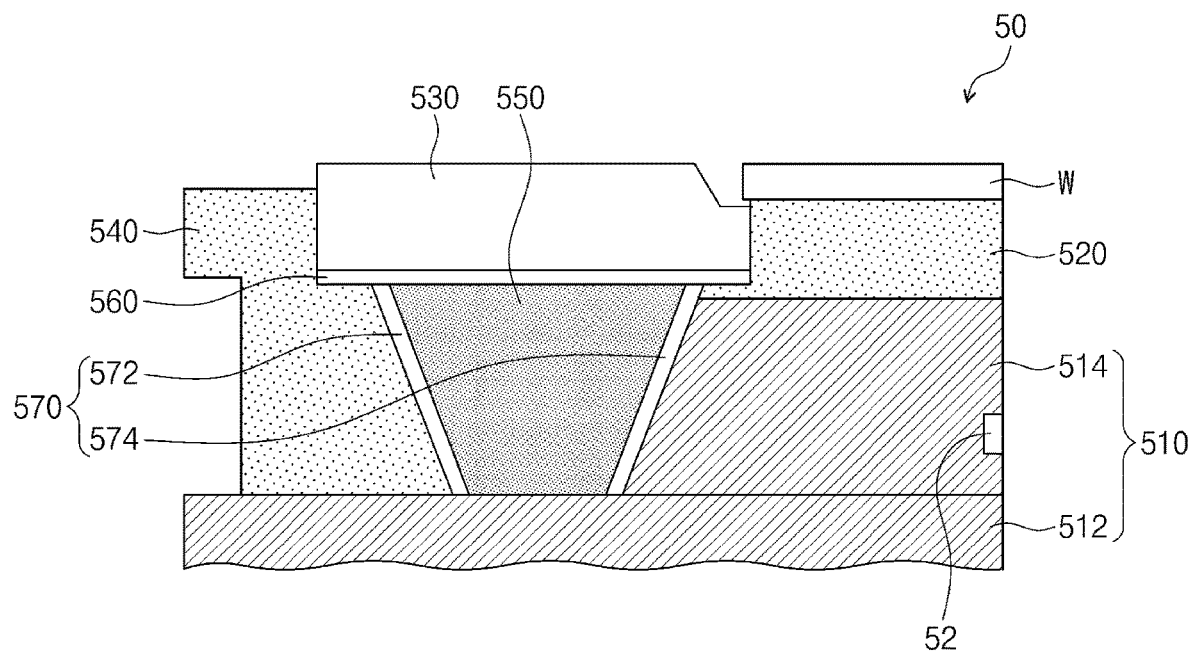
FIG. 5 illustrates a cross-sectional view showing an example of a chuck assembly depicted in FIG. 1 according to example embodiments.

FIG. 5 shows an example of the chuck assembly 50 depicted in FIG. 1 according to example embodiments.

Referring to FIG. 5, the chuck assembly 50 may be configured such that each of the first and second sidewall heat sinks 572 and 574 may have a cross-section shaped like an inclined straight line relative to the top surface of the lower base 512. The first and second sidewall heat sinks 572 and 574 may be sloped symmetrically about the coupling ring 550.

The lower base 512, the upper base 514, the ceramic plate 520, the edge ring 530, the ground ring 540, the coupling ring 550, and the upper heat sink 560 may be configured identically to those of FIG. 2.

Figure 6:
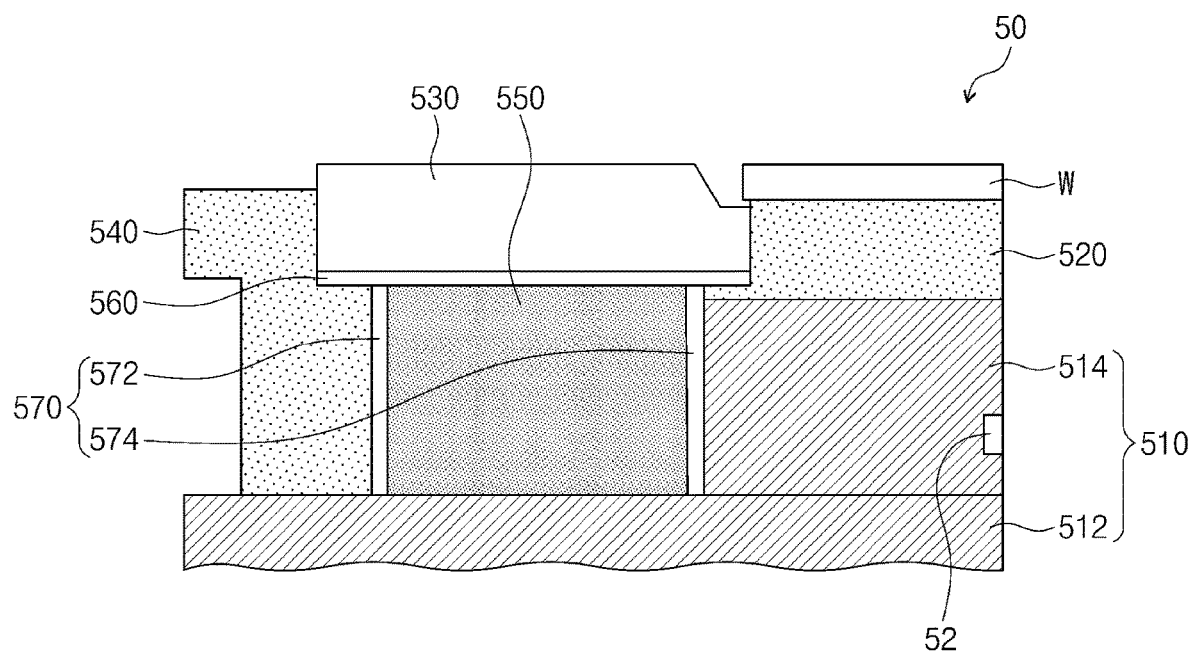
FIG. 6 illustrates a cross-sectional view showing an example of a chuck assembly depicted in FIG. 1 according to example embodiments.

FIG. 6 shows an example of the chuck assembly 50 depicted in FIG. 1 according to example embodiments.

Referring to FIG. 6, the first and second sidewall heat sinks 572 and 574 may have their cross-sections that are perpendicular to the top surface of the lower base 512 and are parallel to each other. The coupling ring 550 may have a tetragonal cross-section.

The lower base 512, the upper base 514, the ceramic plate 520, the edge ring 530, the ground ring 540, the coupling ring 550, and the upper heat sink 560 may be configured identically to those of FIG. 2.

Figure 7:
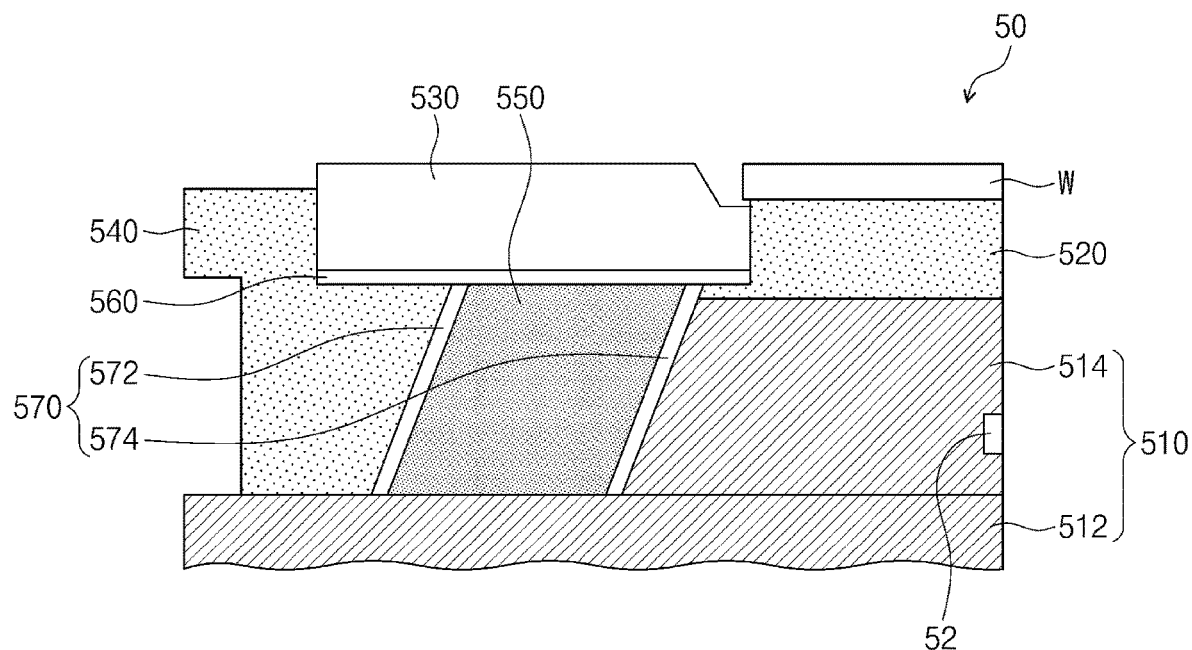
FIG. 7 illustrates a cross-sectional view showing an example of a chuck assembly depicted in FIG. 1 according to example embodiments.

FIG. 7 shows an example of the chuck assembly 50 depicted in FIG. 1 according to example embodiments.

Referring to FIG. 7, the chuck assembly 50 may be configured such that the first and second sidewall heat sinks 572 and 574 may have their cross-sections that are inclined to the top surface of the lower base 512 and are parallel to each other. The coupling ring 550 may have a parallelogram-shaped cross-section.

The lower base 512, the upper base 514, the ceramic plate 520, the edge ring 530, the ground ring 540, the coupling ring 550, and the upper heat sink 560 may be configured identically to those of FIG. 2.

Figure 8:
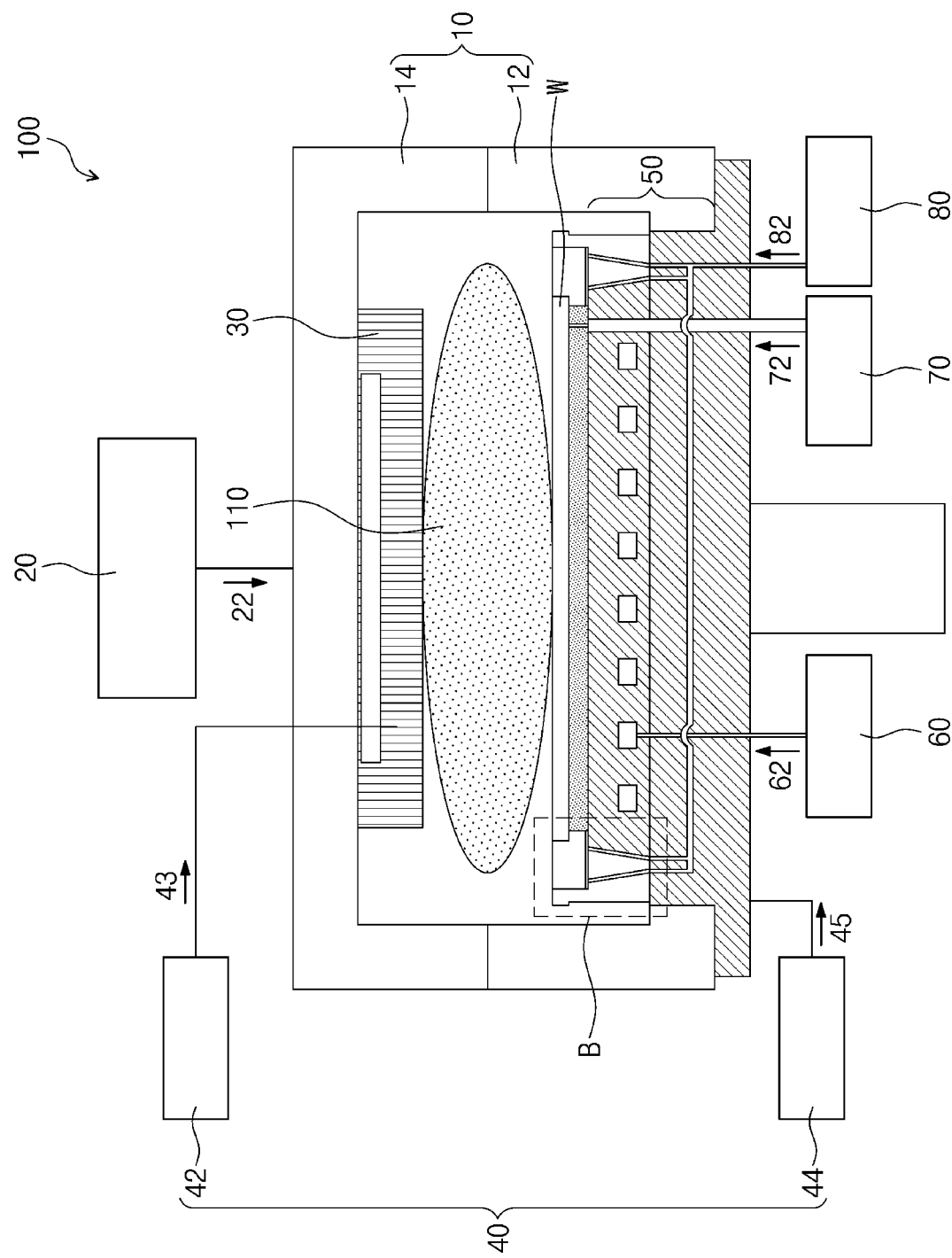
FIG. 8 illustrates a schematic cross-sectional view showing semiconductor device fabricating apparatus according to some example embodiments of the present inventive concepts.

FIG. 8 shows an example of the semiconductor device fabricating apparatus 100 according to the present inventive concepts.

Referring to FIG. 8, the semiconductor device fabricating apparatus 100 of the present inventive concepts may further include a second coolant supply 80. The second coolant supply 80 may be connected to the chuck assembly 50. The second coolant supply 80 may provide the chuck assembly 50 with a second coolant 82. The second coolant 82 may be the same gaseous coolant as that of the first coolant 72. The second coolant 82 may include helium (He).

The chamber 10, the gas supply 20, the showerhead 30, the power supply 40, the cooling-water supply 60, and the first coolant supply 70 may be configured identically to those of FIG. 1.

Figure 9:
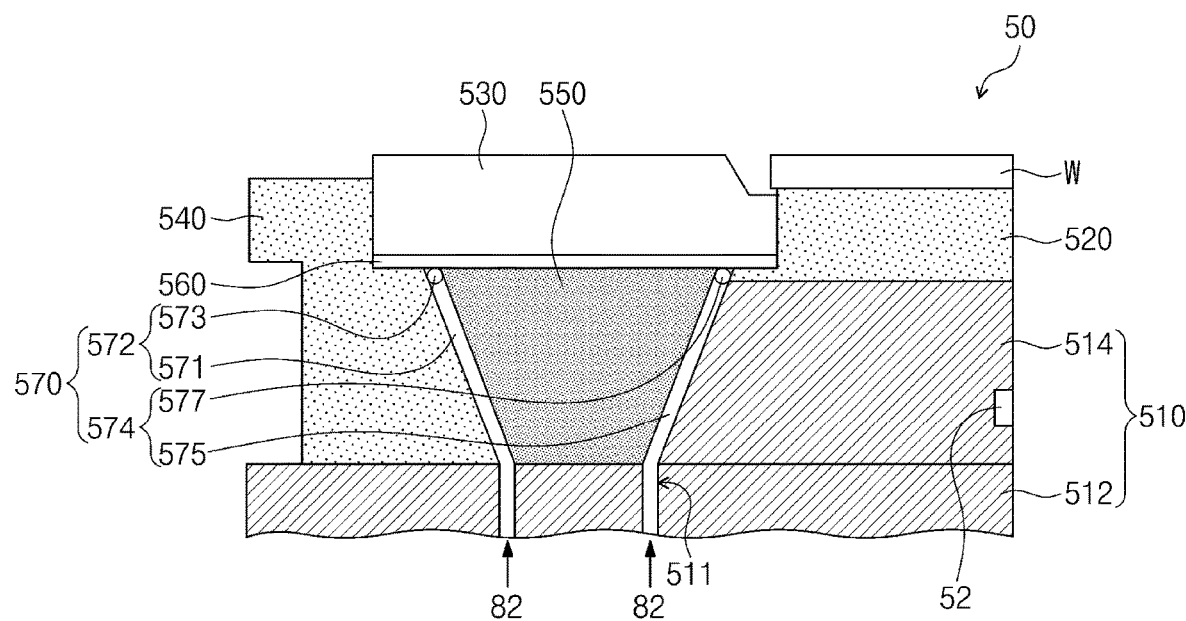
FIG. 9 illustrates a cross-sectional view showing an example of a chuck assembly in section B of FIG. 8 according to example embodiments.

FIG. 9 shows an example of the chuck assembly 50 in section B of FIG. 8 according to example embodiments.

Referring to FIG. 9, the sidewall heat sink 570 of the chuck assembly 50 may use the second coolant 82 to cool the edge ring 530, the ground ring 540, the coupling ring 550, and the upper heat sink 560. According to example embodiments, the edge ring 530 and the ground ring 540 may each have an increased life span.

For example, the lower base 512 may have coolant holes 511. The coolant holes 511 may connect the sidewall heat sink 570 to the second coolant supply 80. The second coolant 82 may be provided through the coolant holes 511 to the sidewall heat sink 570. The coupling ring 550 may have a trapezoidal cross-section. The first and second sidewall heat sinks 572 and 574 of the sidewall heat sink 570 may be in contact with the upper heat sink 560. For example, each of the first and second sidewall heat sinks 572 and 574 may include an air gap and a packing. The term "air" as discussed herein, may refer to atmospheric air, or other gases that may be present during the manufacturing process. It should be appreciated that an "air gap" may comprise a gap having air or other gases (e.g., such as those present during manufacturing) or may comprise a gap forming a vacuum therein.

The first sidewall heat sink 572 may use the second coolant 82 to cool the edge ring 530, the ground ring 540, the coupling ring 550, and the upper heat sink 560. For example, the first sidewall heat sink 572 may include a first air gap 571 and a first packing 573.

The first air gap 571 may be provided between the inner sidewall of the ground ring 540 and the outer sidewall of the coupling ring 550. The first air gap 571 may be spatially connected to one of the coolant holes 511. The first air gap 571 may receive the second coolant 82 to cool the edge ring 530, the ground ring 540, the coupling ring 550, and the upper heat sink 560.

The first packing 573 may be provided in an upper portion of the first air gap 571. The first packing 573 may be in contact with the bottom surface of the upper heat sink 560. The first packing 573 may seal the second coolant 82 into the first air gap 571. The first packing 573 may include, for example, an O-ring, and may be described as a seal, or sealing member or sealing ring.

The second sidewall heat sink 574 may use the second coolant 82 to cool the edge ring 530, the ground ring 540, the coupling ring 550, and the upper heat sink 560. For example, the second sidewall heat sink 574 may include a second air gap 575 and a second packing 577.

The second air gap 575 may be provided between the inner sidewall of the coupling ring 550 and the outer sidewall of the upper base 514. The second air gap 575 may be spatially connected to one of the coolant holes 511. The second air gap 575 may receive the second coolant 82 to cool the upper base 514, the edge ring 530, the coupling ring 550, and the upper heat sink 560.

The second packing 577 may be provided in an upper portion of the second air gap 575. The second packing 577 may be in contact with the bottom surface of the upper heat sink 560. The second packing 577 may seal the second coolant 82 into the second air gap 575. The second packing 577 may include an O-ring.

Figure 10:
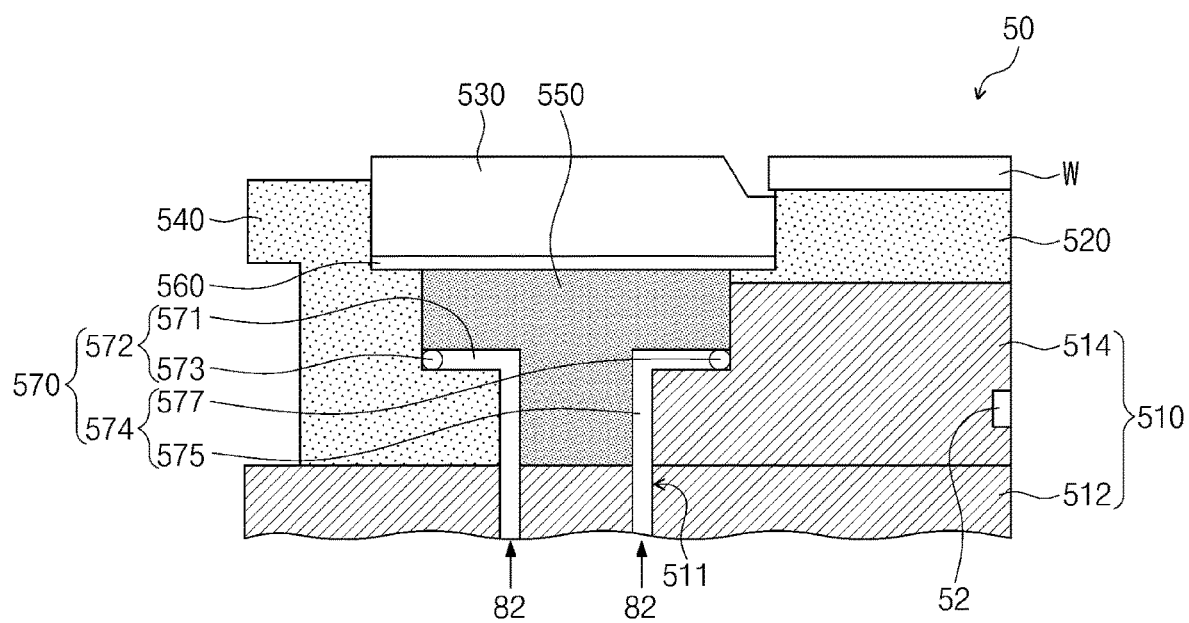
FIG. 10 illustrates a cross-sectional view showing an example of a chuck assembly depicted in FIG. 8 according to example embodiments.

FIG. 10 shows an example of the chuck assembly 50 depicted in FIG. 8 according to example embodiments.

Referring to FIG. 10, the first and second sidewall heat sink 572 and 574 may be separated from the upper heat sink 560. The coupling ring 550 may have a T-shaped cross-section, and the first and second sidewall heat sinks 572 and 574 may have their cross-sections that are bended along opposite sidewalls of the coupling ring 550.

The first air gap 571 of the first sidewall heat sink 572 and the second air gap 575 of the second sidewall heat sink 574 may be separated from the upper heat sink 560 and may be provided to a lower portion of the coupling ring 550. The first packing 573 and the second packing 577 may be provided in upper portions of the first air gap 571 and the second air gap 575, respectively.

The lower base 512, the upper base 514, the ceramic plate 520, the edge ring 530, and the ground ring 540 may be configured identically to those of FIG. 9.

Figure 11:
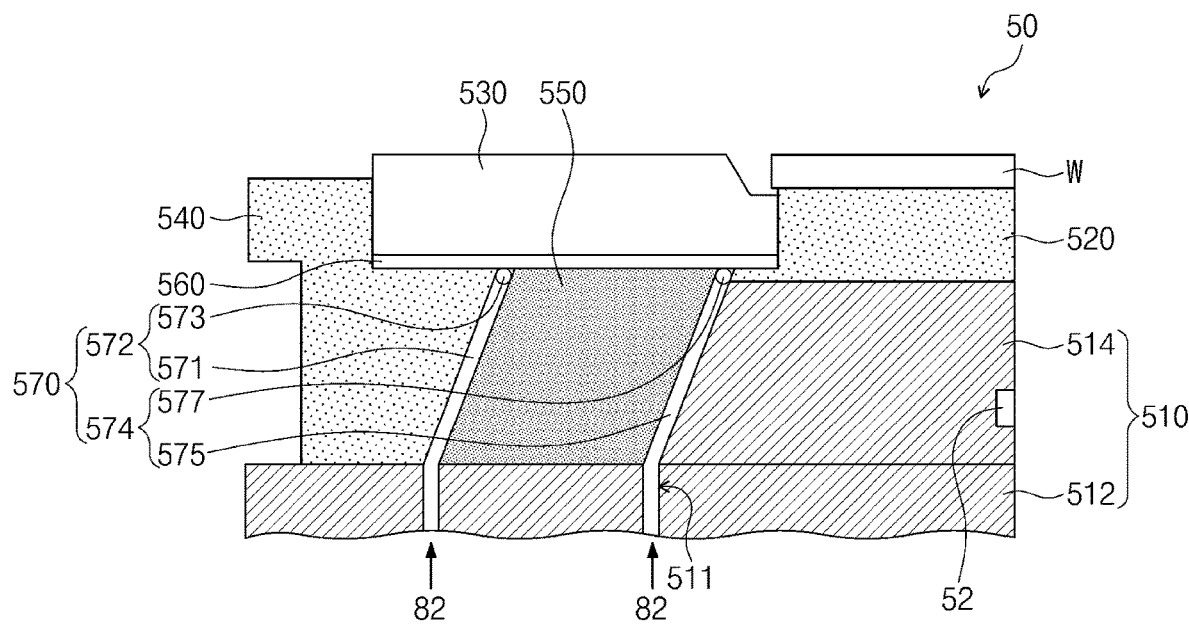
FIG. 11 illustrates a cross-sectional view showing an example of a chuck assembly depicted in FIG. 8 according to example embodiments.

FIG. 11 shows an example of the chuck assembly 50 depicted in FIG. 8 according to example embodiments.

Referring to FIG. 11, the first and second air gaps 571 and 575 may have their cross-sections that are inclined relative to the top surface of the lower base 512 and are parallel to each other. The coupling ring 550 between the first and second air gaps 571 and 575 may have a parallelogram-shaped cross-section.

The lower base 512, the upper base 514, the ceramic plate 520, the edge ring 530, the ground ring 540, the first packing 573, and the second packing 577 may be configured identically to those of FIG. 9.

Figure 12:
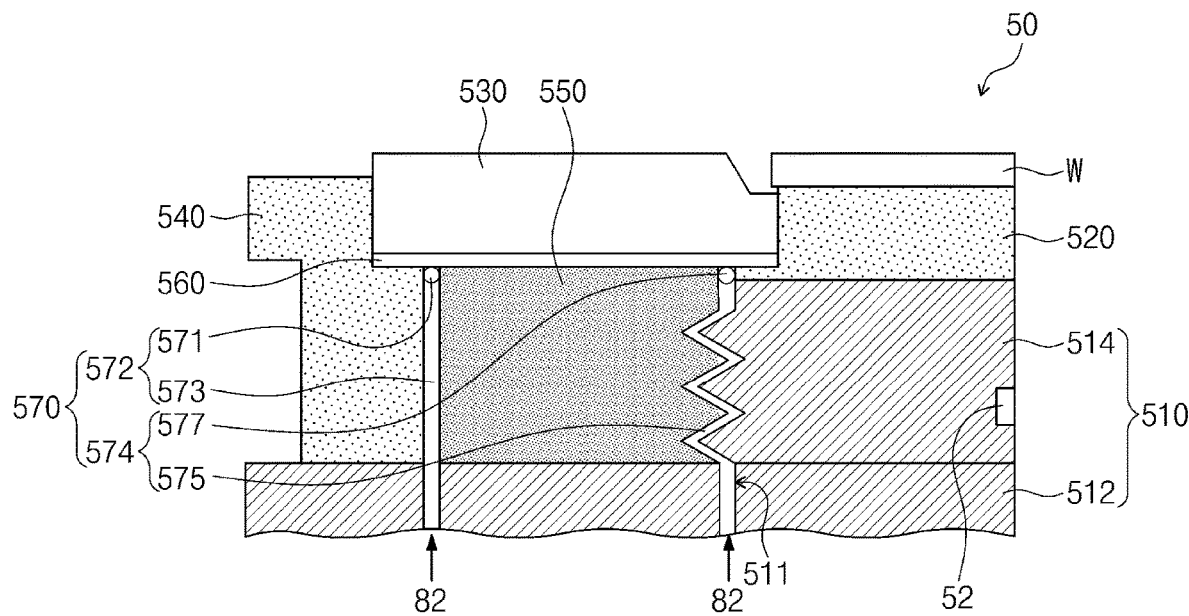
FIG. 12 illustrates a cross-sectional view showing an example of a chuck assembly depicted in FIG. 8 according to example embodiments.

FIG. 12 shows an example of the chuck assembly 50 depicted in FIG. 8 according to example embodiments.

Referring to FIG. 12, the second air gap 575 of the second sidewall heat sink 574 may have a zigzag cross-section. The inner sidewall of the coupling ring 550 may have the same shape as that of the second air gap 575. The coupling ring 550 may have a zigzag cross-section. The inner sidewall of the coupling ring 550 may be exposed to the second coolant 82, and the second air gap 575 may increase a surface area of the inner sidewall of the coupling ring 550, which may result in an increase in life span of the edge ring 530 and the ground ring 540. This result may occur because heat transfer is proportional to a contact area between the coupling ring 550 and the upper base 514. The first air gap 571 may have a cross-section perpendicular to the top surface of the lower base 512.

The lower base 512, the upper base 514, the ceramic plate 520, the edge ring 530, the ground ring 540, the first packing 573, and the second packing 577 may be configured identically to those of FIG. 9.

Figure 13:
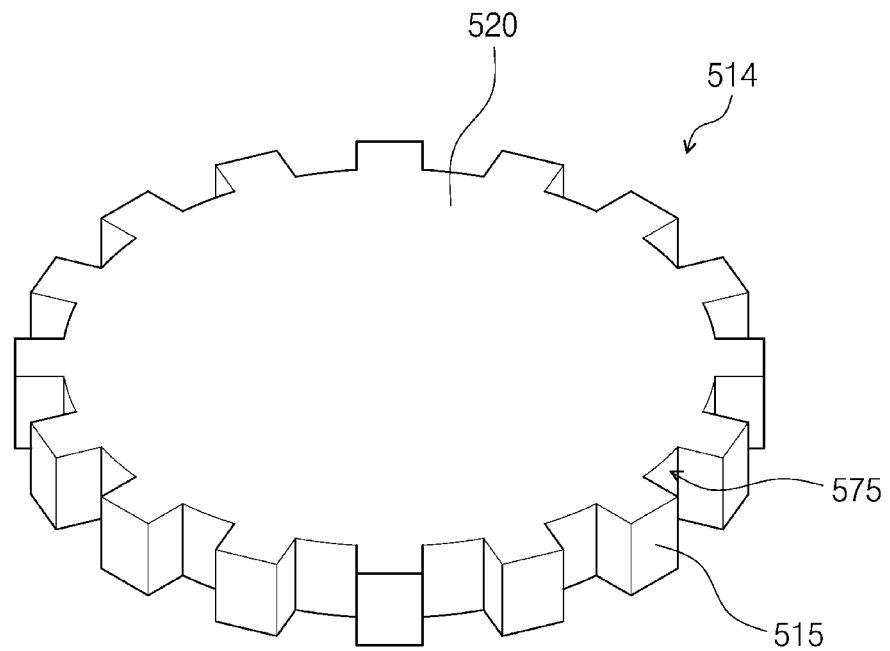
FIG. 13 illustrates a perspective view showing an example of an upper base depicted in FIG. 9 according to example embodiments.

FIG. 13 shows an example of the upper base 514 depicted in FIG. 9 according to example embodiments.

Referring to FIG. 13, the upper base 514 may have a toothed wheel shape. For example, the upper base 514 may have square teeth 515. The square teeth 515 may be periodically arranged along the outer sidewall of the upper base 514. The second air gap 575 may be arranged between the square teeth 515. The square teeth 515 may allow the upper base 514 to have an increased surface area exposed to the second coolant 82. Although not shown, the upper base 514 may include lift pins, a heater electrode, a ground electrode, and a plurality of holes through which the first coolant 72 passes.

Figure 14:
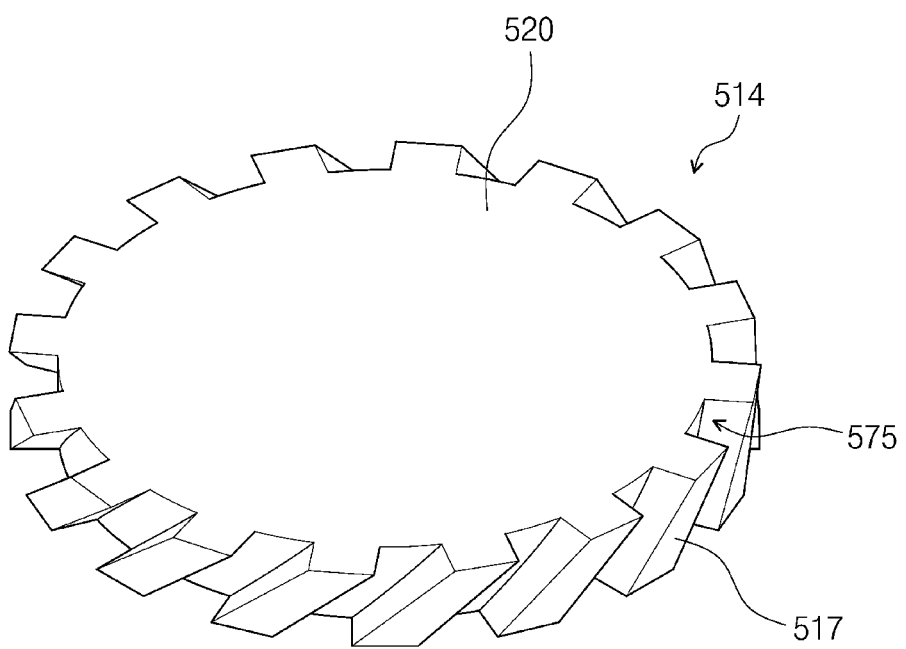
FIG. 14 illustrates a perspective view showing an example of an upper base depicted in FIG. 9 according to example embodiments.

FIG. 14 shows an example of the upper base 514 depicted in FIG. 9 according to example embodiments.

Referring to FIG. 14, the upper base 514 may have a helical gear shape. For example, the upper base 514 may have helical teeth 517. The helical teeth 517 may be periodically arranged along the outer sidewall of the upper base 514. The second air gap 575 may be arranged between the helical teeth 517. The helical teeth 517 may allow the upper base 514 to have an increased surface area exposed to the second coolant 82.

The following will describe a semiconductor device fabricating method by using the semiconductor device fabricating apparatus 100 configured as described above.

Figure 15:
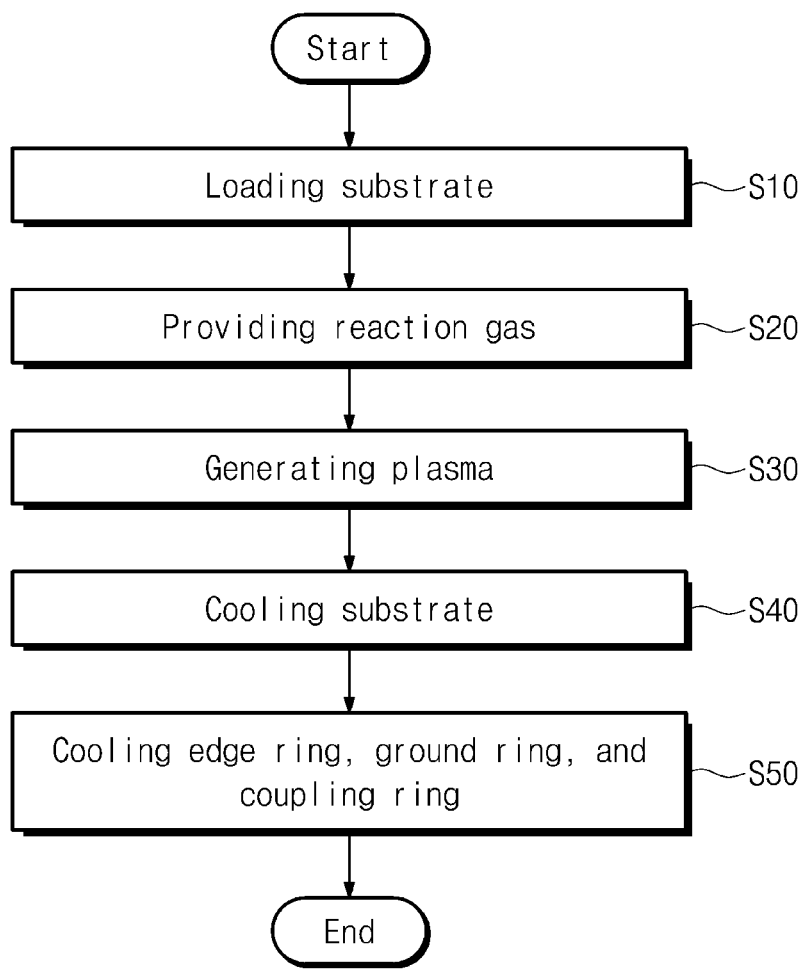
FIG. 15 illustrates a flow chart showing a method of fabricating a semiconductor device according to the present inventive concepts.

FIG. 15 shows a method of fabricating a semiconductor device according to some embodiments of the present inventive concepts.

Referring to FIGS. 1 through 15, the chuck assembly 50 may load the substrate W (S10). The substrate W may be provided on the ceramic plate 520 in the edge ring 530. The chuck assembly 50 may use an electrostatic voltage to rigidly hold the substrate W on the ceramic plate 520.

The gas supply 20 and the showerhead 30 may provide the reaction gas 22 onto the substrate W (S20). The reaction gas 22 may include an etching gas of $CH_3$ or $SF_6$.

The first power supply 42 may supply the source power 43 to generate the plasma 110 on the substrate W (S30). The second power supply 44 may supply the bias power 45 to concentrate the plasma 110 onto the substrate W. The plasma 110 may increase etch rates of the substrate W, the edge ring 530, and the ground ring 540. Alternatively, the plasma 110 may heat the substrate W, the edge ring 530, the ground ring 540, and the coupling ring 550 thereby increasing temperatures of the substrate W, the edge ring 530, the ground ring 540, and the coupling ring 550.

The first coolant supply 70 may supply the first coolant 72 to a bottom surface of the substrate W, thereby cooling the substrate W (S40). The first coolant 72 may cool the substrate W to prevent the substrate W from being over-etched or to increase etching uniformity of the substrate W. For example, the first coolant 72 may include a helium (He) gas.

The upper heat sink 560 and the sidewall heat sink 570 may transfer and/or remove heat from the edge ring 530, the ground ring 540, and the coupling ring 550, thereby cooling the edge ring 530, the ground ring 540, and the coupling ring 550 (S50). For example, the upper heat sink 560 and the sidewall heat sink 570 may include a radiation sheet. The upper heat sink 560 and the sidewall heat sink 570 may transfer heat to the upper base 514 from the edge ring 530, the ground ring 540, and the coupling ring 550.

In example embodiments, the method of fabricating a semiconductor device described in FIG. 15 may include one or more additional steps. For example, in step S60 (not shown), the processed substrate W in step S10 through step S50 may be transported to one or more other chambers for further processing. For example, the substrate W may be transported to a chamber used for adding further layers or components on the substrate W. In step S70 (not shown), in these other chambers, additional processes, such as etching, adding additional layers, forming through vias, and other processes for forming the semiconductor device may be carried out. The semiconductor device may be, for example, a semiconductor memory chip, or semiconductor logic chip including integrated circuits formed thereon. Step S70 may further include mounting the substrate W onto a substrate such as a package substrate, connecting the processed substrate W to the package substrate, and optionally forming a mold layer to cover the package substrate and the substrate W. In step S80 (not shown), individual semiconductor devices, such as semiconductor chips or semiconductor packages are formed. For example, cutting may be performed, using a laser or other cutting device, to form individual semiconductor chips or packages. A different chamber may be used for this step as well.

Referring to FIG. 8, the step S50 of cooling the edge ring 530, the ground ring 540, and the coupling ring 550 may include providing the sidewall heat sink 570 with the second coolant 82. For example, the upper heat sink 560 may include a radiation sheet, and the sidewall heat sink 570 may include at least one air gap and at least one packing. For example, the first sidewall heat sink 572 of the sidewall heat sink 570 may include the first air gap 571 and the first packing 573, and the second sidewall heat sink 574 may include the second air gap 575 and the second packing 577. The second coolant supply 80 may provide the first and second air gaps 571 and 575 with the second coolant 82 to cool the edge ring 530, the ground ring 540, and the coupling ring 550. Accordingly, it may be possible to prevent the substrate W from being over-etched and to increase etching uniformity of the substrate W and life spans of the edge ring 530 and the ground ring 540 that are exposed to the plasma 110.

A chuck assembly according to some embodiments of the present inventive concepts may be configured such that a sidewall heat sink on an outer sidewall of a coupling ring is used to cool an edge ring and a ground ring, and that the edge ring and the ground ring may increase in life span.

Although the present disclosure has been described in connection with some embodiments of the present inventive concepts illustrated in the accompanying drawings, it will be understood to those skilled in the art that various changes and modifications may be made without departing from the technical spirit and essential feature of the present inventive concepts. It therefore will be understood that the embodiments described above are just illustrative but not limitative in all aspects. Accordingly, all such modifications are intended to be included within the scope of the present disclosure as defined in the appended claims.

What is claimed is:

1. A chuck assembly, comprising:
a chuck base that includes a lower base and an upper base on the lower base;
a ceramic plate on the upper base;
an edge ring on an outer sidewall of the ceramic plate and on an edge portion of the lower base;
a ground ring that surrounds an outer sidewall of the edge ring on the edge portion of the lower base;
a coupling ring between an inner sidewall of the ground ring and an outer sidewall of the upper base and between the edge portion of the lower base and a bottom surface of the edge ring;
an upper heat sink between a top surface of the coupling ring and the bottom surface of the edge ring; and
a sidewall heat sink between an outer sidewall of the coupling ring and the inner sidewall of the ground ring and between an inner sidewall of the coupling ring and the outer sidewall of the upper base.

2. The chuck assembly of claim 1, wherein the sidewall heat sink has an inclination angle of about 22° to about 48.5° relative to a bottom surface of the upper heat sink.

3. The chuck assembly of claim 1, wherein the sidewall heat sink includes a radiation sheet.

4. The chuck assembly of claim 1, wherein the sidewall heat sink includes:

a first sidewall heat sink between the inner sidewall of the ground ring and the outer sidewall of the coupling ring; and
a second sidewall heat sink between the inner sidewall of the coupling ring and the outer sidewall of the upper base.

5. The chuck assembly of claim 4, wherein each of the first and second sidewall heat sinks connects the upper heat sink to the edge portion of the lower base.

6. The chuck assembly of claim 4, wherein the first sidewall heat sink includes:
a first air gap; and
a first packing in an upper portion of the first air gap.

7. The chuck assembly of claim 6, wherein the second sidewall heat sink includes:
a second air gap; and
a second packing in an upper portion of the second air gap.

8. The chuck assembly of claim 7, wherein the lower base has a plurality of coolant holes connected to the first and second air gaps.

9. The chuck assembly of claim 4, wherein the second sidewall heat sink has a zigzag cross-section.

10. The chuck assembly of claim 1, wherein the upper base has a toothed wheel shape or a helical gear shape.

11. An apparatus for fabricating a semiconductor device, comprising:
a chamber that includes a lower housing and an upper housing on the lower housing;
a showerhead in an upper portion of the upper housing;
a chuck assembly in a lower portion of the lower housing, the chuck assembly for loading a substrate; and
a first coolant supply connected to the chuck assembly, the first coolant supply configured to provide a first coolant to a bottom surface of the substrate,
wherein the chuck assembly includes:
a chuck base that includes a lower base and an upper base on the lower base;
a ceramic plate on the upper base;
an edge ring on an outer sidewall of the ceramic plate and on an edge portion of the lower base;
a ground ring that surrounds an outer sidewall of the edge ring on the edge portion of the lower base;
a coupling ring between an inner sidewall of the ground ring and an outer sidewall of the upper base and between the edge portion of the lower base and a bottom surface of the edge ring;
an upper heat sink between a top surface of the coupling ring and the bottom surface of the edge ring; and
a sidewall heat sink between an outer sidewall of the coupling ring and the inner sidewall of the ground ring and between an inner sidewall of the coupling ring and the outer sidewall of the upper base.

12. The apparatus of claim 11, further comprising:
a second coolant supply configured to provide a second coolant into the sidewall heat sink.

13. The apparatus of claim 12, wherein the sidewall heat sink includes:
a first sidewall heat sink between the inner sidewall of the ground ring and the outer sidewall of the coupling ring; and
a second sidewall heat sink between the inner sidewall of the coupling ring and the outer sidewall of the upper base, the second sidewall heat sink being located more inwardly in the chuck assembly than the first sidewall heat sink.

14. The apparatus of claim 13, wherein the first sidewall heat sink includes:
  a first air gap that receives the second coolant; and
  a first packing in an upper portion of the first air gap, the first packing sealing the second coolant.

15. The apparatus of claim 13, wherein the second sidewall heat sink includes:
  a second air gap that receives the second coolant; and
  a second packing in an upper portion of the second air gap, the second packing sealing the second coolant.

16. A method of fabricating a semiconductor device, comprising:
  loading a substrate on a ceramic plate on a chuck base;
  providing a reaction gas onto the substrate;
  providing a source power to generate plasma on the substrate;
  cooling the substrate by providing a first coolant to a bottom surface of the substrate through the chuck base and the ceramic plate; and
  cooling an edge ring that surrounds the substrate, a ground ring that surrounds the edge ring, and a coupling ring below the edge ring by using an upper heat sink between the edge ring and an edge portion of the chuck base and a sidewall heat sink between the upper heat sink and the edge portion of the chuck base.

17. The method of claim 16, wherein the sidewall heat sink has an inclination angle of about 22° to about 48.5° relative to a bottom surface of the upper heat sink.

18. The method of claim 16, wherein the coupling ring has a Y-shaped, T-shaped, tetragonal, trapezoidal, or parallelogram-shaped cross-section, and
  wherein the sidewall heat sink has a bended, vertical, or inclined cross-section.

19. The method of claim 16, wherein the chuck base includes:
  a lower base; and
  an upper base on a center of the lower base, and
  wherein the sidewall heat sink includes:
    a first air gap between an inner sidewall of the ground ring and an outer sidewall of the coupling ring; and
    a second air gap between an inner sidewall of the coupling ring and an outer sidewall of the upper base.

20. The method of claim 19, wherein cooling the edge, ground, and coupling rings includes providing a second coolant into the first and second air gaps.

* * * * *